United States Patent
Stephens

(10) Patent No.: US 7,060,515 B2
(45) Date of Patent: Jun. 13, 2006

(54) METHOD OF MANUFACTURING A LASER DIODE PACKAGE

(75) Inventor: Edward F. Stephens, Dittmer, MO (US)

(73) Assignee: Cutting Edge Optronics, Inc., St. Charles, MO (US)

( * ) Notice: Subject to any disclaimer, the term of this patent is extended or adjusted under 35 U.S.C. 154(b) by 390 days.

(21) Appl. No.: 10/672,991

(22) Filed: Sep. 26, 2003

(65) Prior Publication Data

US 2004/0082112 A1    Apr. 29, 2004

Related U.S. Application Data

(62) Division of application No. 09/280,783, filed on Mar. 29, 1999, now Pat. No. 6,636,538.

(51) Int. Cl.
*H01L 21/00* (2006.01)
*H01L 21/44* (2006.01)

(52) U.S. Cl. .......................... 438/25; 438/122
(58) Field of Classification Search ................ 438/25, 438/26, 28, 106, 109, 111, 122; 372/34, 372/36; 174/52.4
See application file for complete search history.

(56) References Cited

U.S. PATENT DOCUMENTS

| | | | |
|---|---|---|---|
| 3,303,432 A | 2/1967 | Garfinkel et al. ........... 331/94.5 |
| 3,339,151 A | 8/1967 | Smith | |
| 3,590,248 A | 6/1971 | Chatterton, Jr. | |
| 3,654,497 A | 4/1972 | Dyment et al. ................. 372/8 |
| 3,771,031 A | 11/1973 | Kay | |
| 3,802,967 A | 4/1974 | Ladany et al. ............... 438/479 |
| 3,896,473 A | 7/1975 | DiLorenzo et al. ........... 372/36 |
| 3,958,263 A | 5/1976 | Panish et al. ................. 372/45 |
| 3,962,655 A | 6/1976 | Selway et al. | |
| 4,092,614 A | 5/1978 | Sakuma et al. ............ 331/94.5 |
| 4,315,225 A | 2/1982 | Allen, Jr. et al. | |
| 4,383,270 A | 5/1983 | Schelhorn ..................... 357/71 |
| 4,393,393 A | 7/1983 | Allen, Jr. et al. ............. 357/81 |
| 4,454,602 A | 6/1984 | Smith | |
| 4,573,067 A | 2/1986 | Tuckerman et al. .......... 357/82 |

(Continued)

FOREIGN PATENT DOCUMENTS

EP     0 458 469 A1    11/1991    ................. 257/675

(Continued)

OTHER PUBLICATIONS

Coherent Laser Group, Laser Diodes and Bars, 5 pages (no date).

(Continued)

*Primary Examiner*—Brook Kebede
(74) *Attorney, Agent, or Firm*—Jenkens & Gilchrist

(57) ABSTRACT

A laser diode package includes a heat sink, a laser diode, and an electrically nonconductive (i.e. insulative) substrate. The laser diode has an emitting surface and a reflective surface opposing the emitting surface. The laser diode further has first and second side surfaces between the emitting and reflective surfaces. The heat sink has an upper surface and a lower surface. The first side surface of the laser diode is attached to the heat sink adjacent to the upper surface. The substrate is attached to the lower surface of the heat sink. The heat sink is made of heat conducting metal such as copper and the substrate is preferably made from gallium arsenide. The substrate is soldered to the heat sink as is the laser diode bar. Due to the presence of the substrate at the lower end of the heat sink, each individual laser diode package has its own electrical isolation. Several packages can be easily attached together to form a laser diode array.

19 Claims, 8 Drawing Sheets

U.S. PATENT DOCUMENTS

| | | | |
|---|---|---|---|
| 4,617,585 A | 10/1986 | Yasui | 357/72 |
| 4,716,568 A | 12/1987 | Scifres et al. | |
| 4,730,324 A | 3/1988 | Azad | |
| 4,831,629 A | 5/1989 | Paoli et al. | |
| 4,847,848 A | 7/1989 | Inoue et al. | |
| 4,877,641 A | 10/1989 | Dory | 427/38 |
| 4,881,237 A | 11/1989 | Donnelly | 372/50 |
| 4,899,204 A | 2/1990 | Rosen et al. | 357/30 |
| 4,901,330 A | 2/1990 | Wolfram et al. | |
| 4,949,346 A | 8/1990 | Kuper et al. | |
| 4,975,923 A | 12/1990 | Buus et al. | 372/50 |
| 5,001,355 A | 3/1991 | Rosen et al. | 250/551 |
| 5,022,042 A | 6/1991 | Bradley | |
| 5,031,187 A | 7/1991 | Orenstein et al. | 372/50 |
| 5,040,187 A | 8/1991 | Karpinski | |
| 5,073,838 A | 12/1991 | Ames | 361/103 |
| 5,084,888 A | 1/1992 | Tajima et al. | |
| 5,099,214 A | 3/1992 | Rosen et al. | |
| 5,099,488 A | 3/1992 | Ahrabi et al. | 372/361 |
| 5,105,429 A | 4/1992 | Mundinger et al. | 372/34 |
| 5,115,445 A | 5/1992 | Mooradian | |
| 5,128,951 A | 7/1992 | Karpinski | |
| 5,156,999 A | 10/1992 | Lee | 437/215 |
| 5,163,064 A | 11/1992 | Kim et al. | 372/50 |
| 5,212,699 A | 5/1993 | Masuko et al. | 372/34 |
| 5,216,263 A | 6/1993 | Paoli | 257/88 |
| 5,216,688 A | 6/1993 | Kortz et al. | 372/75 |
| 5,284,790 A | 2/1994 | Karpinski | |
| 5,287,375 A | 2/1994 | Fujimoto | 372/38 |
| 5,305,344 A | 4/1994 | Patel | |
| 5,311,535 A | 5/1994 | Karpinski | |
| 5,311,536 A | 5/1994 | Paoli et al. | |
| 5,323,411 A | 6/1994 | Shirasaka et al. | 372/43 |
| 5,325,384 A | 6/1994 | Herb et al. | |
| 5,337,325 A | 8/1994 | Hwang | 372/36 |
| 5,351,259 A | 9/1994 | Ishimori et al. | |
| 5,388,755 A | 2/1995 | Baxter | |
| 5,394,426 A | 2/1995 | Joslin | |
| 5,394,427 A | 2/1995 | McMinn et al. | 372/70 |
| 5,402,436 A | 3/1995 | Paoli | |
| 5,402,437 A | 3/1995 | Mooradian | |
| 5,438,580 A | 8/1995 | Patel et al. | |
| 5,485,482 A | 1/1996 | Selker et al. | |
| 5,526,373 A | 6/1996 | Karpinski | |
| 5,663,979 A | 9/1997 | Marshall | 372/103 |
| 5,764,675 A | 6/1998 | Juhala | |
| 5,835,515 A * | 11/1998 | Huang | 372/36 |
| 5,835,518 A | 11/1998 | Mundinger et al. | 372/50 |
| 5,898,211 A | 4/1999 | Marshall et al. | 257/601 |
| 5,987,043 A | 11/1999 | Brown et al. | 372/36 |
| 6,295,307 B1 * | 9/2001 | Hoden et al. | 372/36 |
| 6,352,873 B1 | 3/2002 | Hoden | 438/28 |

FOREIGN PATENT DOCUMENTS

| | | | |
|---|---|---|---|
| EP | 0 550 996 A1 | 1/1992 | |
| EP | 0 634 822 A1 | 1/1995 | |
| EP | 0 805 527 A2 | 11/1997 | |
| EP | 0 833 419 A1 | 4/1998 | |
| JP | 55-65450 | 5/1980 | 257/675 |
| JP | 59-067639 | 6/1984 | |
| JP | 3-269325 | 11/1987 | 257/625 |
| JP | 2-281782 | 11/1990 | |
| JP | 3-6875 | 1/1991 | |
| JP | 4-023381 | 1/1992 | |
| JP | 4-359207 | 12/1992 | |
| JP | 6-13717 | 1/1994 | |

OTHER PUBLICATIONS

Endriz et al., "High Power Diode Laser Arrays," IEEE J. Quantum Electronics, vol. 28, No. 4, pp. 952-965 (Apr. 1992).

IBM Technical Disclosure Bulletin, vol. 31, No. 12, pp. 5-7 (May 1989).

IBM Technical Disclosure Bulletin, vol. 31, No. 6, pp. 372-373 (Nov. 1988).

Thomson/CSF Semiconducteurs Specifiques, Package Specification (schematic), p. 3 (no date).

Patent Abstracts of Japan, vol. 15, No. 54, 2 pages (Feb. 8, 1991).

Anonymous, "Thermal Spacer For Room Temperature Close Packed GaAs Laser Arrays," IBM Technical Disclosure Bulletin, vol. 12, No. 12, 1 page (May 1970).

Mundinger, D., et al., "High Average Power Edge Emitting Laser Diode Arrays On Silicon Microchannel Coolers," Applied Physics Letters, vol. 57, No. 21, pp. 2172-2174 (Nov. 19, 1990).

* cited by examiner

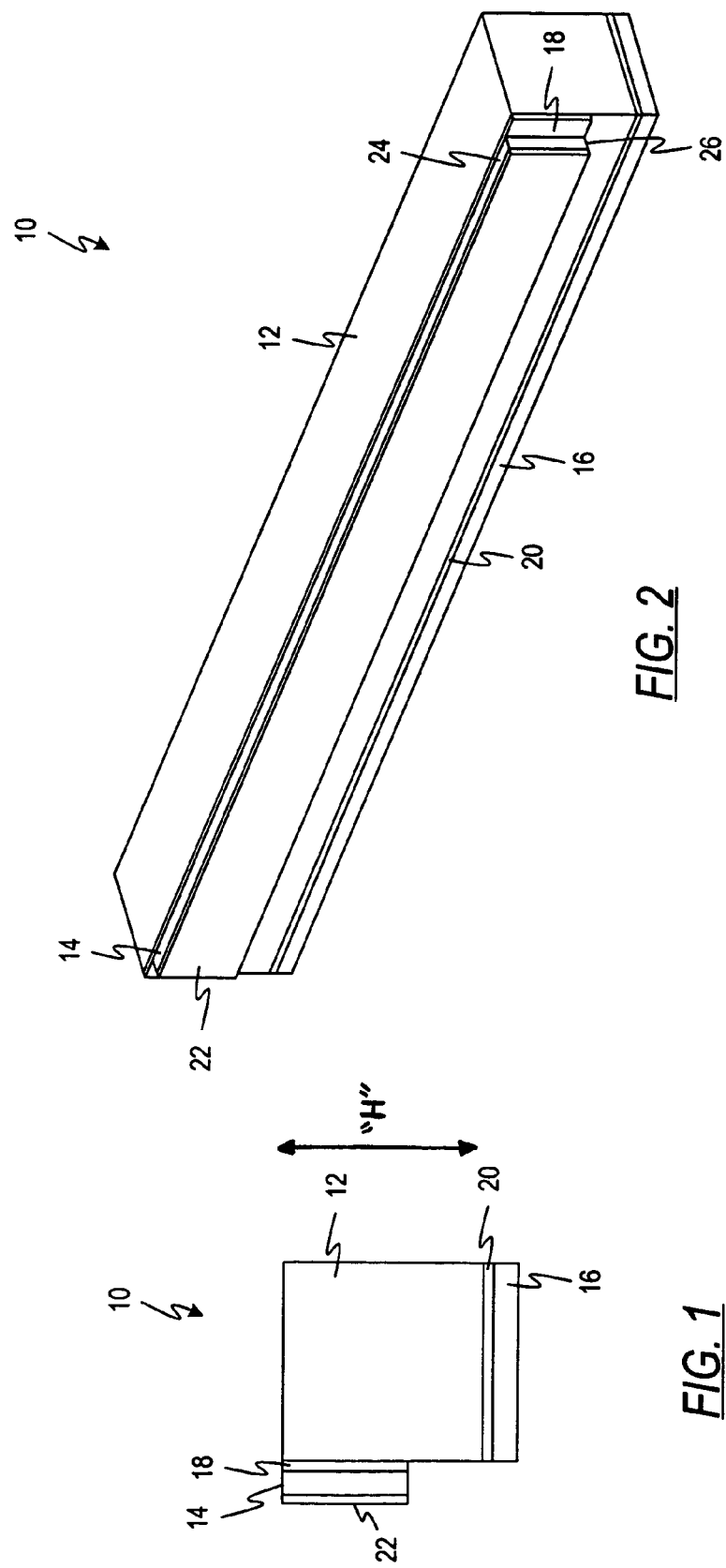

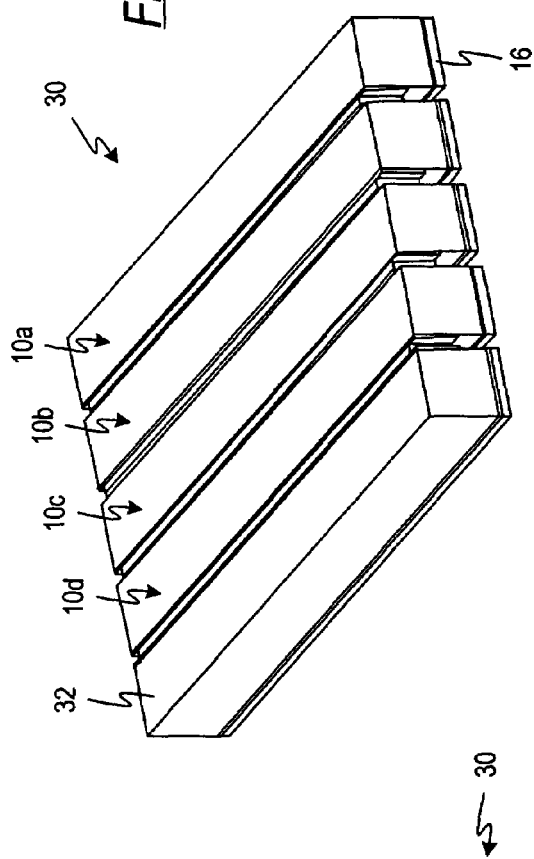
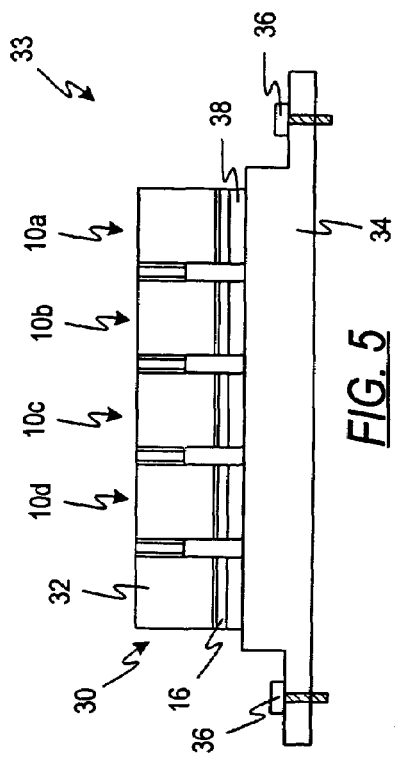
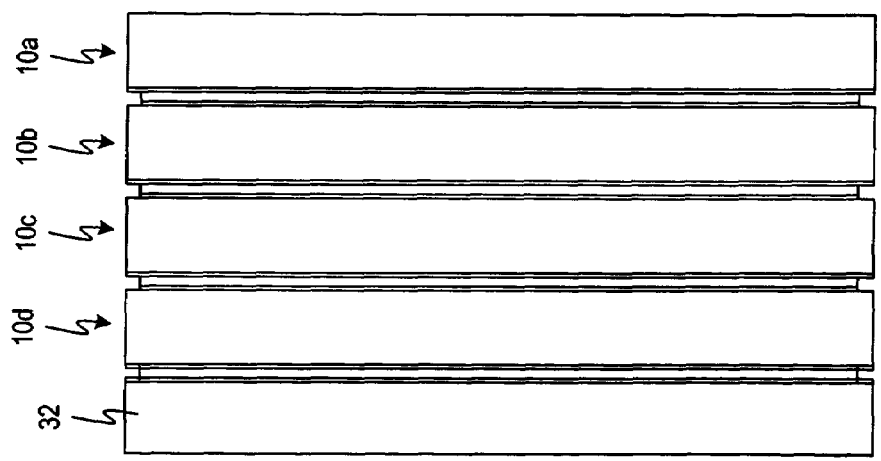

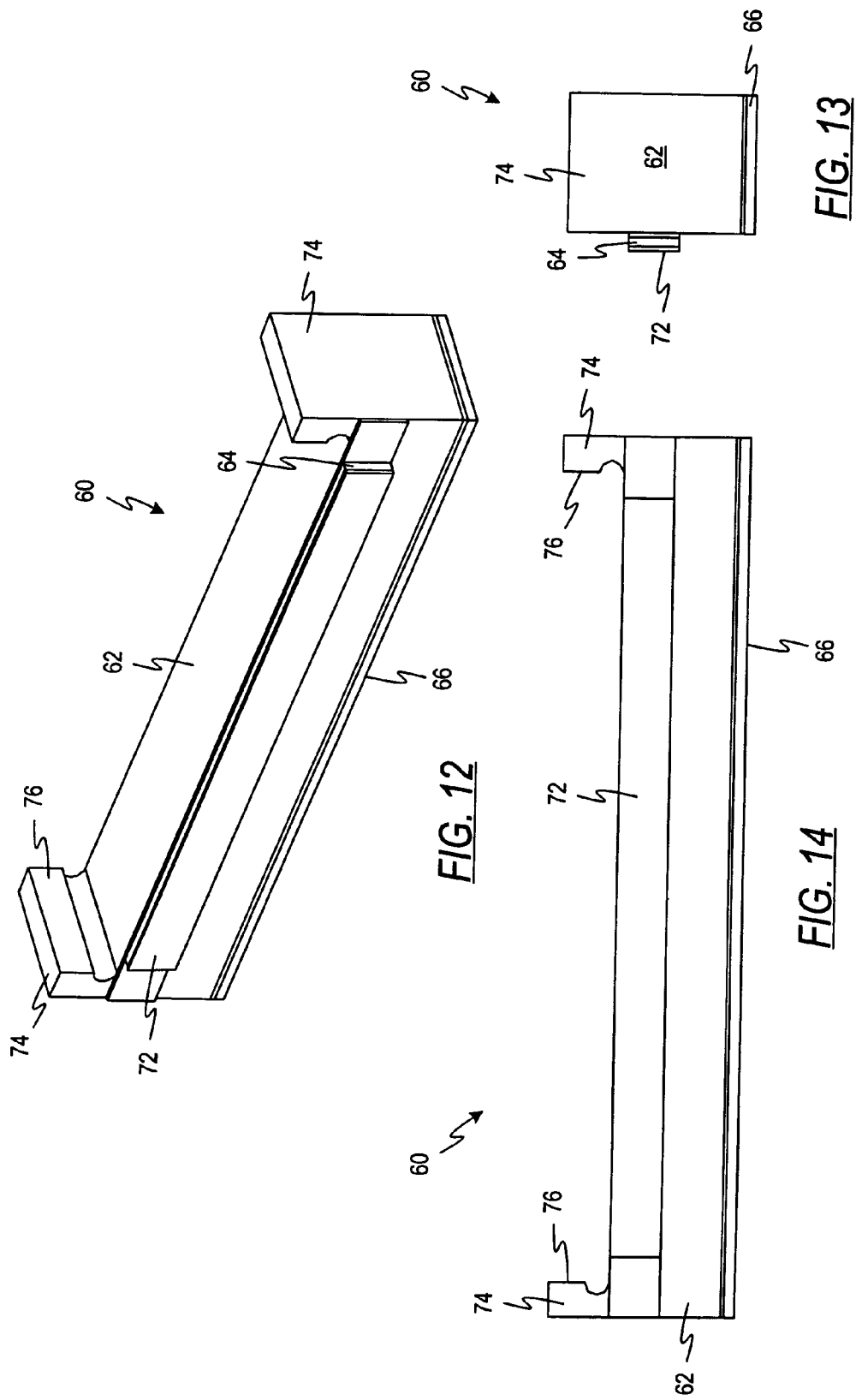

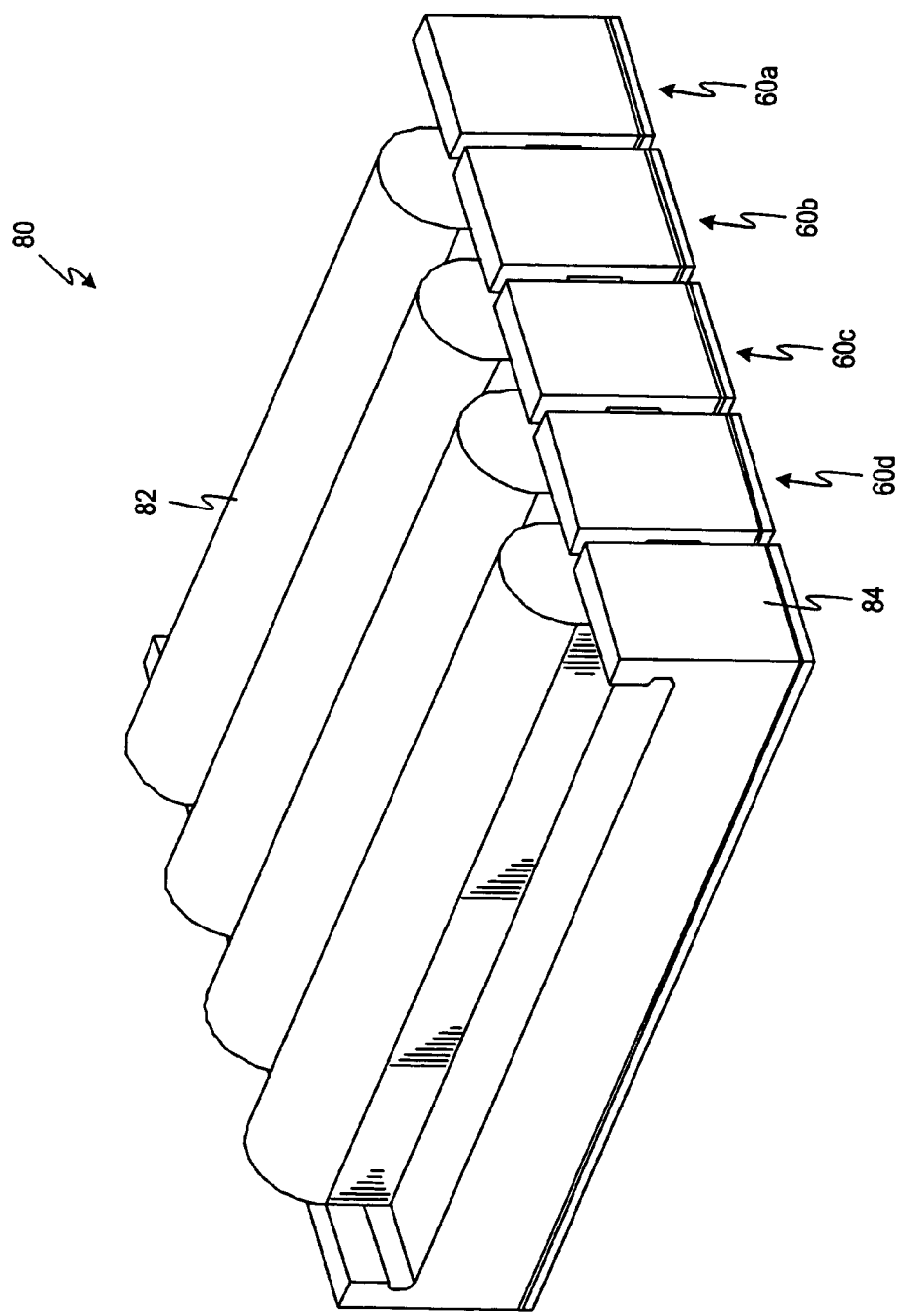

METHOD OF MANUFACTURING A LASER DIODE PACKAGE

RELATED APPLICATION

This application is a divisional of U.S. patent application Ser. No. 09/280,783, filed Mar. 29, 1999, now allowed, U.S. Pat. No. 6,636,538 entitled "Laser Diode Packaging."

FIELD OF THE INVENTION

The present invention relates generally to lasers diodes and, in particular, to a package for a laser diode that is easy to manufacture, has a low thermal resistance, and requires no beryllium oxide.

BACKGROUND OF THE INVENTION

Semiconductor laser diodes have numerous advantages. They are small in that the widths of their active regions are typically submicron to a few microns and their heights are usually no more than a fraction of a millimeter. The length of their active regions is typically less than about a millimeter. The internal reflective surfaces, which produce emission in one direction, are formed by cleaving the substrate from which the laser diodes are produced and, thus, have high mechanical stability.

High efficiencies are possible with semiconductor laser diodes with some pulsed junction laser diodes having external quantum efficiencies near 50%. Semiconductor lasers produce radiation at wavelengths from about 20 to about 0.7 microns depending on the semiconductor alloy that is used. For example, laser diodes made of gallium arsenide with aluminum doping (AlGaAs) emit radiation at approximately 0.8 microns (~800 nm) which is near the absorption spectrum of common solid state laser rods and slabs made from Neodymium doped, Yttrium-Aluminum Garnet (Nd:YAG), and other crystals and glasses. Thus, semiconductor laser diodes can be used as the optical pumping source for larger, solid state laser systems.

Universal utilization of semiconductor laser diodes has been restricted by thermally related problems. These problems are associated with the large heat dissipation per unit area of the laser diodes which results in elevated junction temperatures and stresses induced by thermal cycling. Laser diode efficiency and the service life of the laser diode is decreased as the operating temperature in the junction increases.

Furthermore, the emitted wavelength of a laser diode is a function of its junction temperature. Thus, when a specific output wavelength is desired, maintaining a constant junction temperature is essential. For example, AlGaAs laser diodes that are used to pump a Nd:YAG rod or slab should emit radiation at about 808 nm since this is the wavelength at which optimum energy absorption exists in the Nd:YAG. But, for every 3.5° C. to 4.0° C. deviation in the junction temperature of the AlGaAs laser diode, the wavelength shifts 1 nm. Accordingly, controlling the junction temperature and, thus, properly dissipating the heat is critical.

When solid state laser rods or slabs are pumped by laser diodes, dissipation of the heat becomes more problematic since it becomes necessary to densely pack a plurality of individual diodes into arrays which generate the required amounts of input power for the larger, solid state laser rod or slab. However, when the packing density of the individual laser diodes is increased, the space available for extraction of heat from the individual laser diodes decreases. This aggravates the problem of heat extraction from the arrays of individual diodes.

To remove heat from the laser diodes, some laser diode array packages have used beryllium oxide which has a relatively high thermal conductivity while being electrically insulative. One known commercially available package which attempts to resolve these thermally-related problems by use of beryllium oxide is produced by Laser Diode Array Inc. of Auburn, N.Y. This package generally includes a beryllium oxide structure into which a plurality of grooves are cut, etched or sawed. A metallized layer extends from groove to groove to conduct electricity through the laser diodes that are within the grooves.

However, beryllium oxide is a hazardous material and requires additional care in handling. This is especially true when the beryllium oxide is being mechanically processed (e.g. cutting or sawing) which produces airborne particles of the beryllium oxide. Because it requires additional care in handling and shipping (e.g. additional BeO warning labels), it is relatively expensive when considering the cost of the overall laser diode array package. Additionally, once the laser diode bar is placed within the groove, its reflective surface is not accessible for cleaning after the array has been assembled. Furthermore, it is difficult to test an individual laser diode bar before it is placed in the grooves. Thus, a laser diode bar lacking the desired operational characteristics for a specific array must often be removed from a groove after it has been installed.

A need exists for a thermally efficient laser diode package which is easy to assemble and test, and which preferably lacks the hazardous beryllium oxide.

SUMMARY OF THE INVENTION

The present invention solves the aforementioned problems by providing a laser diode package that includes a heat sink, a laser diode, and an electrically nonconductive (i.e. insulative) substrate. The laser diode has an emitting surface and a reflective surface opposing the emitting surface. The laser diode further has first and second side surfaces between the emitting and reflective surfaces. The heat sink has an upper surface and a lower surface. The first side surface of the laser diode is attached to the heat sink adjacent to the upper surface of the heat sink. The substrate is attached to the lower surface of the heat sink.

Preferably, the heat sink is made of heat conducting metal such as copper and the substrate is primarily made from gallium arsenide. The substrate is soldered to the heat sink as is the laser diode. In one embodiment, the heat sink is coated with a layer of solder such that at least its surfaces that will contact the laser diode and the substrate are "pretinned." The laser diode and substrate are then attached to the heat sink during one soldering step in which the heat sink is heated above the melting point of the solder layer on its surface.

The exposed second side surface of the laser diode preferably includes a layer of solder so that two packages can be joined. Accordingly, the heat sink of a first package is placed in contact with the laser diode bar of a second adjacent package. The packages are then heated to a point where the solder layer on the laser diode reflows and the laser diode of the second package becomes integral with the heat sink of the adjacent first package. To avoid reflowing all solder present in the package, the solder layer on the laser diode is a lower melting temperature solder than the other resident solders of the package. Numerous individual packages can be made integral in such a fashion resulting in a multi-bar laser diode array.

A laser diode package and a laser diode array that are constructed in this manner lack the hazardous beryllium oxide. More importantly, each individual package has its own electrical isolation and can be directly soldered to an ultimate heat sink. Furthermore, each individual package can be tested on its own before being placed in an array to ensure that it will function within the operational parameters (e.g. wavelength and power) desired for such an array. When the substrate is made of a cleaveable material such as GaAs, it can be produced with relatively small dimensions thereby minimizing the thermal resistance between the laser diode and the ultimate heat sink. The resulting laser diode package can be used for continuous wave (CW) modes of operation or for pulsed modes of operation.

The above summary of the present invention is not intended to represent each embodiment, or every aspect, of the present invention. This is the purpose of the figures and the detailed description which follow.

BRIEF DESCRIPTION OF THE DRAWINGS

Other objects and advantages of the invention will become apparent upon reading the following detailed description and upon reference to the drawings in which:

FIG. 1 is an end view of the inventive laser diode package;

FIG. 2 is a perspective view of the inventive laser diode package;

FIG. 3 is a perspective view of a laser diode array comprised of the laser diode packages of FIGS. 1 and 2;

FIG. 4 is a top view of the laser diode array of FIG. 3;

FIG. 5 is an end view of the laser diode array of FIG. 3 including a heat spreader for mounting the laser diode array;

FIG. 12 is a perspective view of an alternative laser diode package for use with a collimating lens;

FIG. 13 is an end view of FIG. 12;

FIG. 14 is a side view of FIG. 12;

FIG. 15 is a laser diode array assembly with a plurality of collimating lens mounted thereto.

Figure 6:
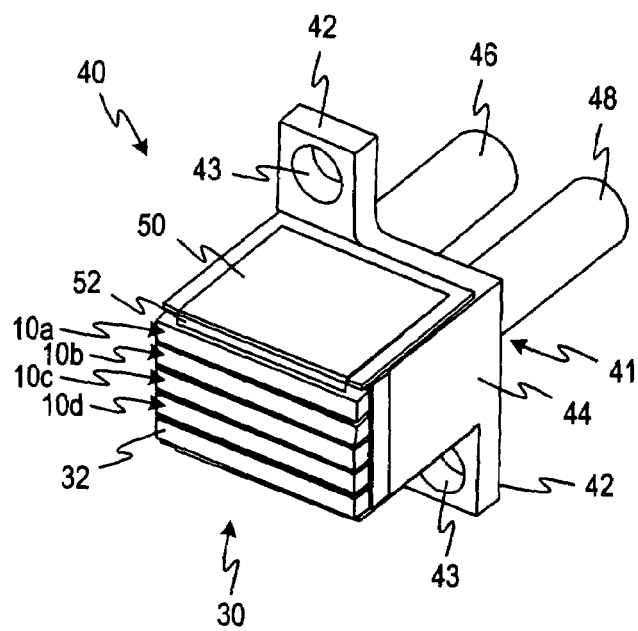
FIG. 6 is a perspective view of the laser diode array mounted on a heat exchanger.

While the invention is susceptible to various modifications and alternative forms, a specific embodiment thereof has been shown by way of example in the drawings and will herein be described in detail. It should be understood, however, that it is not intended to limit the invention to the particular forms disclosed. To the contrary, the intention is to cover all modifications, equivalents, and alternatives falling within the spirit and scope of the invention as defined by the appended claims.

DETAILED DESCRIPTION OF THE INVENTION

Referring initially to FIGS. 1 and 2, a laser diode package 10 includes a heat sink 12, a laser diode bar 14, and a lower substrate 16. The laser diode bar 14 is attached to the heat sink 12 through a first solder layer 18. The substrate 16 is attached to the heat sink 12 through a second solder layer 20. The laser diode bar 14 may also include a bar solder layer 22 on its side which opposes the heat sink 12. The method by which such a bar solder layer 22 is applied is described in detail with respect to FIGS. 8–11.

The laser diode bar 14 has an emitting surface 24 at its upper end and a reflective surface 26 that opposes the emitting surface 24. The height of the laser diode bar 14 is defined as the distance between the emitting surface 24 and reflective surface 26. The junction of the laser diode 14, which is the region at which the photons are emitted from the laser diode bar 14, is typically closer to the heat sink 12. However, the junction of the laser diode bar 14 can be closer to the exposed end of the laser diode bar 14 on which the solder layer 22 is placed. Electrical power is guided to defined regions of the junctions by providing electrically conductive material within the laser diode bar 14 adjacent those emitting regions and less electrically conductive material outside those regions. Thus, the laser diode bar 14 has a multitude of emission points on the emitting surface 24 corresponding to those regions where electrical energy is converted into optical energy. When the electrical power is applied to the laser diode package 10, the photons propagate through the junction, are reflected off the reflective surface 26, and consequently emit only from the emitting surface 24 in a direction perpendicular to it.

The heat sink 12 of the laser diode package 10 is made of a material that is both electrically and thermally conductive, such as copper. Electrical conductivity is required to conduct the electrical current through the laser diode bar 14 to produce the optical energy. Thermal conductivity is needed to conduct the intense heat away from the laser diode bar 14 and maintain the laser diode bar 14 at a reasonable operating temperature.

The substrate 16 serves the function of electrically isolating the current-conducting heat sink 12 from the ultimate heat sink, which is typically a metallic heat exchanger. The substrate 16 can be a variety of materials which are electrically insulative. In a preferred embodiment, the substrate 16 is made of semi-insulating or undoped gallium arsenide ("GaAs"). While GaAs is also a hazardous material, it can be cleaved to make the substrates which eliminates the need for any mechanical processes resulting in dust particles. The substrate 16 made of an electrically insulative material, such as GaAs, must have a metalization layer if its surface is to be soldered.

Further, if the substrate 16 is made of GaAs, it can be cleaved such that its dimensional tolerances are very small (e.g. ±2–3 microns) such that its width can be approximately the same width of the heat sink 12. Substrates made from GaAs can be made by polishing a wafer of GaAs to the desired thickness and cleaving the wafer into numerous substrates. The polished thickness of the wafer corresponds to the height of the substrate 16 that is present below the second solder layer 20 as shown in FIG. 1. If the substrate 16 is to be soldered, it is metallized after being polished. For example, the GaAs substrate 16 has a height in the range from about 0.003 inch to about 0.006 inch. Because the height is so small, the thermal resistance between the lowermost surface of the heat sink 12 and the ultimate thermal heat sink (e.g. a heat exchanger) is very small. Further, when the electrically insulative substrate 16 is made this thin, the overall height of the package 10 can be reduced as well.

While the substrate 16 is preferably made of cleavable GaAs, the substrate 16 may be made of other electrically insulative materials, such as diamond, boron nitride, silicon, or aluminum nitride, which have a high thermal conductivity. Further, the substrate 16 could be made of beryllium oxide. Also, it is possible to attach the substrate 16 to the heat sink 12 with an adhesive.

It is also possible to provide the lowermost surface of the heat sink 12 with an electrically insulative coating, such as silicon oxide. Such a coating would make the heat sink 12 and substrate 16 integral while providing adequate electrical insulation and minimal thermal resistance. Further, it is also possible to make the heat sink 14 from an electrically nonconductive base material which has a metallic region, such as a solder coating over its uppermost surface, for conducting the electrical current through the laser diode bar 14.

The heat sinks 12 of the laser diode packages 10 are preferably manufactured in such a way to have the material for the solder layers 18 and 20 on their exterior surface (i.e. "pretinned"). First, the heat sinks 12, which are preferably copper, are dipped into a rosin based flux to prepare their exterior surfaces for being coated with a solder layer. The flux is preferably an activated rosin flux such as Alpha No. 809 flux manufactured by the Alpha Metals of Jersey City, N.J. After the heat sinks 12 have been dipped into the flux, they are then dipped into molten indium which results in a solder layer on their exterior surfaces. Next, the end surfaces of the heat sinks 12 are placed on a hot plate which maintains their temperature above the melting point of indium (~157° C.) so that the excess indium can be blown from the exterior surfaces with air. Alternatively, the excess solder can be removed through a solder wick material, such as mesh copper fibers. In a further alternative, the heat sinks 12, once removed from the molten indium, are subjected to a hot air source which has a temperature above the melting point of the indium. This eliminates the need for a hot plate. In these alternative processing steps, the goal is to provide a relatively even thickness of the indium solder layer. Preferably, the solder layer on the exterior surface of each heat sink 12 has a thickness of about 1–5 mils (about 0.001 inch to about 0.005 inch).

Once the excess indium is removed and the desired indium thickness is achieved, the heat sinks 12 are dipped into acetone to remove any additional flux that may be present on their exterior surfaces. The heat sinks 12 are then stored in an environment where oxidation of the indium is inhibited. One example of such an environment is a hexane bath into which the heat sinks 12 are submerged. Alternatively, the heat sinks 12 may be dipped into a flux cleaning solution followed by immersion into an antioxidation solution. Both of these solutions are manufactured by Kester Solder Corporation of Des Plaines, Ill.

Consequently, the first and second solder layers 18 and 20 can be produced by a single solder layer present on the entire heat sink 12. This eliminates the need to accurately locate individual solder layers for interfacing with the laser diode bar 14 and the substrate 16 although such a methodology will also perform the desired function. It should be noted that the figures do not illustrate a constant layer of solder around the heat sinks 12, but only reveal the existence of such a solder layer in areas where a solder bond exists.

During the assembly process, the individual who is assembling the laser diode package 10 can determine whether the emitting surface 24 of the laser diode bar 14 extends too far above or too far below the upper surfaces of the heat sink 12. If the emitting surface 24 is located too far above the heat sink 12, there is no place for the heat produced on the upper portion of the laser diode bar 14 adjacent to the emitting surface 24 to be conducted which is one of the primary purposes of the heat sink 12. If this is the case, then it is likely that the laser diode bar 14 will catastrophically fail due to an extreme temperature condition. On the other hand, if the emitting surface 24 of the laser diode bar 14 is positioned too far below the upper surface of the heat sink 12, then the output energy of the laser diode bar 14 may be reduced due to the fact that the side surface of the heat sink 12 facing the laser diode bar 14 will absorb or undesirably reflect the emitting energy which causes a reduction in the output of laser diode bar 14. Consequently, it is preferred that the emitting surface 24 be positioned substantially flush (i.e. substantially coplanar) with the upper surfaces of the heat sink 12. In the preferred embodiment, the emitting surface 24 is positioned within about 1 mil (i.e. ±0.001 inch) of the upper surfaces of the heat sink 12.

Referring now to FIG. 3, a laser diode array 30 is illustrated which includes four laser diode packages 10a, 10b, 10c, 10d. These laser diode packages 10 are configured in the manner shown with respect to FIGS. 1 and 2. The laser diode array 30 also includes an end heat sink 32 which mates against the laser diode bar 14 of the laser diode package 10d. The end heat sink 32 is no different than the heat sink 12 shown in FIGS. 1 and 2 except for the fact that it is not packaged with a laser diode bar.

To attach each heat sink of a laser diode package 10 to the diode bar of the adjacent laser diode package 10, the laser diode bars 14 of the laser diode array 30 are subjected to a rosin-activated flux ("RA flux") which assists in adhering the solder layer 22 to the adjacent heat sinks. The packages are then heated to the point where the bar solder layer 22 (FIGS. 1 and 2) liquefies (e.g. ~157° C. when pure indium is used). To this end, the bar solder layer 22 is preferably made of a lower melting temperature solder than the first solder layer 18 and the second solder layer 20 such that the heating process to liquefy the bar solder layer 22 does not also liquefy the first and second solder layers 18 and 20. This is especially needed when the heat sink 12 has been entirely coated with a solder layer, such as pure indium, as described above. For example, the solder layer 22 may be an indium alloy solder with a melting point of 143° C. Once the heat which causes the reflow of the solder layer 22 is removed, the solder layer 22 again solidifies to produce one integral unit as is shown in FIG. 3. When the heat sink 12 is pretinned with pure indium on its exterior surfaces, the solder layer 22 on the laser diode bar 14 adheres to the pure indium that is present on the heat sink 12. The laser diode array 30 is then cleaned by immersion in a heated acetone bath after which the laser diode array 30 is stored in a low humidity environment (e.g. a desiccant cabinet or a dry box). Alternatively, the laser diode array 30 can be subjected to a forced spray of acetone. Because the reflective surfaces 26 of the laser diode bars 14 in the packages 10 are exposed between adjacent heat sinks 12, the reflective surfaces 26 of all of the laser diode bars 14 and, of course, the emitting surfaces 22 can be cleaned in this cleaning step. Also, while the multi-bar array 30 has been described, a single package 10 can be made integral with a free heat sink (i.e. like heat sink 32) to make a one bar array.

FIG. 4 is a top view of the laser diode array 30 of FIG. 3 which illustrates the relative dimensions of the heat sink 12 and the diode bar 14. Each heat sink 12 has a width of less than about 0.2 inch, and preferably about 0.12 inch, and a length of about 0.4 inch. The height of each heat sink 12 is about 45 mils (0.045 inch), as shown in FIG. 3, before being dipped in the molten solder that produces the solder layers 18 and 20. After being dipped, the height is about 50 mils (0.050 inch). Considering the height of the substrate 16 is only about 3 mils to about 6 mils when GaAs is used, the overall height of the package 10 is about 50–60 mils (0.050 inch to 0.060 inch). The laser diode bar 14 has a width of approximately 5 mils (0.005 inch) and the height of the laser diode bar 14 is usually about 20–25 mils (0.020 inch to 0.025 inch). Also, if the array 30 is to be operated in a pulsed mode, the width of the heat sinks 12 can be reduced since the average waste heat produced is less. For example, the heat sink 12 may have a width of only about 0.005 inch to about 0.02 inch for pulsed mode arrays.

FIG. 5 illustrates a laser diode array assembly 33 with a laser diode array 30 and heat spreader structure 34. The heat spreader structure 34 generally includes a plurality of fasteners 36 to attach the entire assembly to a heat exchanger positioned therebelow. The heat spreader 34 is typically made of highly thermal conductive material such as copper.

To attach the laser diode array 30 to the heat spreader 34, a substrate solder layer 38 is located between the substrate 16 of each package 10 and the heat spreader 34. To ensure that the solder layers 18, 20, and 22 of each laser diode package 10 do not liquefy during attachment, the substrate solder layer 38 is preferably made of a lower temperature solder than the other solder layers present in the laser diode package 10. Alternatively, if the laser diode array 30 is to be assembled from the laser diode packages 10 at the same time as the laser diode array 30 is attached to the heat spreader 34, the bar solder layer 22 and the substrate solder layer 38 can be made of the same material such that the heating of the overall assembly causes the two solder layers 22 and 38 to liquefy and, after cooling, form the integral unit. As can be seen in FIG. 5, each individual substrate 16 of the array 30 is spaced away from adjacent substrates 16 such that its side surfaces are free from contact adjacent substrates 16.

To create optical energy, electrical current must be conducted through each laser diode bar 14 of the laser diode array 30. When viewing the laser diode array 30 from left to right in FIGS. 3 or 5, the electrical current flows into the heat sink of the first package 10a, into the adjacent laser diode, and continues through each package 10 before exiting through the free heat sink 32. There is no electrical path below each laser diode package 10 due to the substrate 16. It is this electrical current through the laser diodes 12 that produces the optical energy from the laser diode assembly 10.

It should be noted that due to the manufacturing process by which the laser diode bar 14 is produced, the laser diode 14 inherently includes some curvature along its length. Because of this inherent curvature, the distance from the exterior surfaces of the laser diode bar 14 to the surfaces of the adjacent heat sinks 12 will vary as a function of the length of laser diode bar 14. This resulting gap between the laser diode bar 14 and the heat sinks, which varies in size, is filled with the appropriate thickness of solder such that contact with the heat sinks is established along the entire length of the laser diode bar 14. In other words, the process by which the laser diode array 30 is assembled tends to provide a constant electrical contact along the entire length of the laser diode bars 14 even though the laser diode bar 14 has an inherent curvature which could normally produce voids in the solder contact. Furthermore, it should be noted that even if voids appear adjacent to the laser diode bar 14 after the assembly process, additional solder can be added to fill in these voids to maintain the appropriate electrical and thermal contact along the entire length of the laser diode bar 14.

Figure 7:
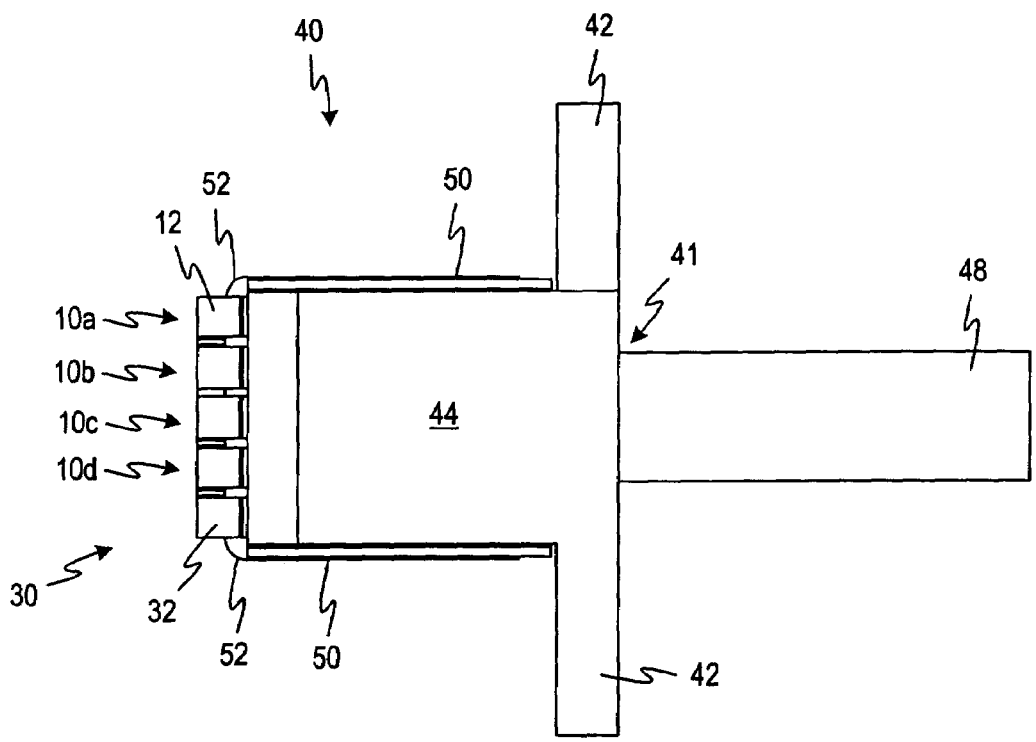
FIG. 7 is an end view of FIG. 6.

FIGS. 6 and 7 illustrate a laser diode array assembly 40 which includes the laser diode array 30 attached directly to a heat exchanger 41. This configuration is different than the assembly shown in FIG. 5 in that no heat spreader 34 is present as the laser diode array 30 is soldered directly onto the ultimate heat sinking reservoir, the heat exchanger 41. The heat exchanger 41 includes mounting sections 42, each of which includes a bore 43 for passage of a fastener. The internal fins (not shown) of the heat exchanger 41 are located within the body 44 of the heat exchanger 41. Fluid passes into the body 44 through an inlet 46 and the fluid is discharged from the body 44 through an outlet 48. The side of the body 44 includes a contact 50 for receiving the requisite electrical input energy. The contact 50 includes two leads 52 for connecting the heat sink 12 of the first laser diode package 10a to the top contact 50 and the free end heat sink 32 to the bottom contact 50. Each of the contacts 52 are electrically insulated on their surfaces contacting the body 44 of the heat exchanger 40 to ensure current flows only into the laser diode array 30.

Figure 8:
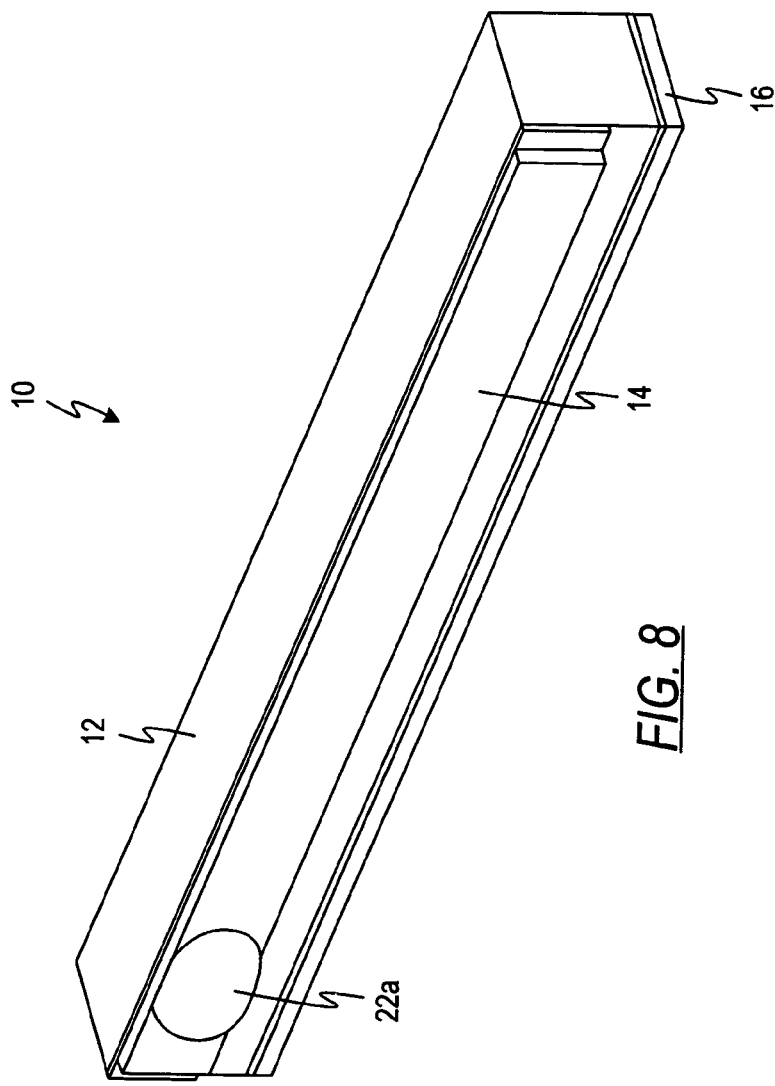
FIG. 8 is a perspective view of the laser diode package of FIG. 1 during assembly.
Figure 9:
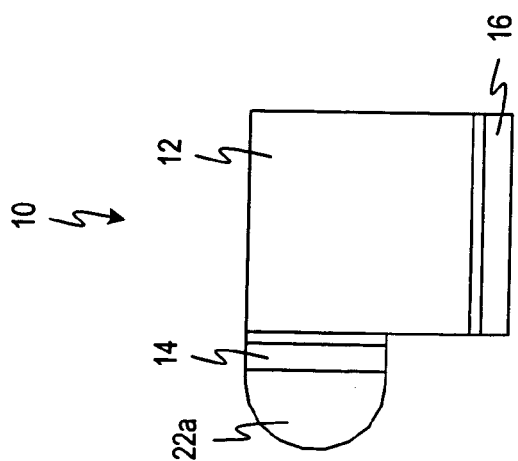
FIG. 9 is an end view of FIG. 8.

FIGS. 8–11 illustrate the two steps by which the bar solder layer 22 is applied to the laser diode bar 14. In FIGS. 8 and 9, a solder deposit 22a is placed on a portion of the laser diode bar 14. At this point, the entire laser diode package 10 can be heated to the point above the solder melting point of the solder deposit 22a. Once the solder deposit 22a is placed on a laser diode bar 14, the goal is to spread the solder deposit 22a evenly along the entire length of the laser diode bar 14 to create a thin solder layer. Because of the existence of the first and second solder layers 18 and 20 in the laser diode package 10, the solder for the solder deposit 22a is chosen to have a lower melting temperature than the first and second solder layers 18 and 20.

Figure 10:
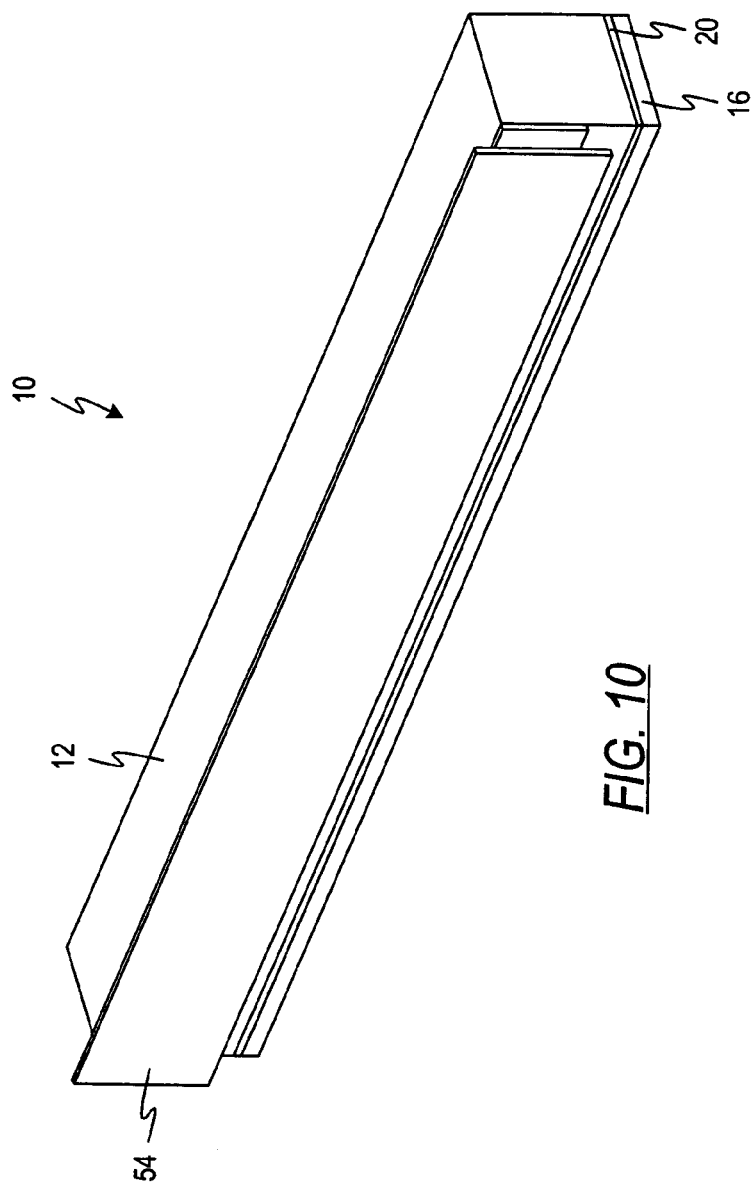
FIG. 10 is a perspective view of the laser diode package of FIG. 1 during assembly.
Figure 11:
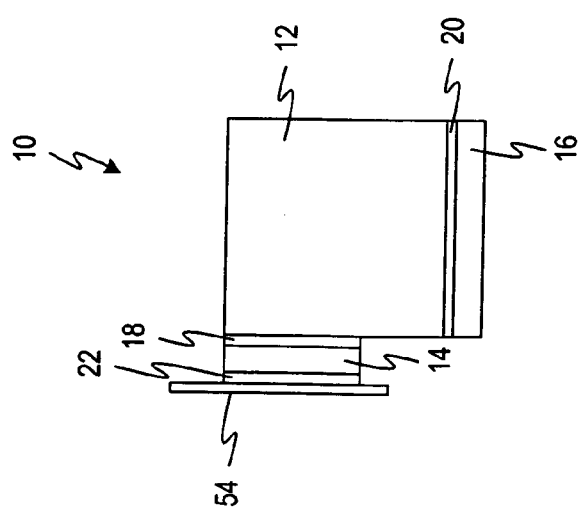
FIG. 11 is an end view of FIG. 10.

As shown in FIGS. 10 and 11, a wetting structure 54, which can be simply a piece of copper foil, is placed at a location where it engages the solder deposit 22a. Due to capillary action, the solder deposit 22a begins to move along the length of the wetting structure 54 so as to cover the entire laser diode bar 14. While this wetting structure 54 is performing its function, heat is being applied to the laser diode package 10 to maintain the solder deposit 22a in its liquid form. One method by which the entire assembly is heated is by placing the lower surface of the substrate 16 against a heating plate. The wetting structure 54 is moved away from the laser diode bar 14 while the solder layer 22 is still in its liquid form.

FIGS. 12–14 illustrate an alternative laser diode package 60 which includes structure for mounting a lens. The laser diode package 60 includes a heat sink 62, a laser diode bar 64 and a substrate 66, just as in the configurations shown in FIGS. 1 and 2. The laser diode bar 64 and the substrate 66 are soldered to the heat sink 62 in a similar manner described with reference to FIGS. 1 and 2. The laser diode bar 64 preferably has a bar solder layer 72 applied to its exposed side in the manner described with reference to FIGS. 8–11.

The heat sink 62 includes at each end a lens mount 74 which extends upwardly in the direction away from the substrate 66. The lens mount 74 further includes two flat surfaces 76 which receive an ultra-violet radiation ("UV") activated adhesive. When a lens is placed in its final alignment position, the package 60 is exposed to UV radiation which activates the UV adhesive and holds the lens in its final position.

FIG. 15 illustrates a laser diode array 80 which includes a plurality of lenses 82. The laser diode array 80 is comprised of five laser diode packages 60a, 60b, 60c, 60d, and 60e, as described with reference to FIGS. 12–14. Adjacent to the laser diode package 60e is a free heat sink 84 which is soldered to the laser diode bar within the laser diode package 60e. The free heat sink 84 also includes the lens mount structure as described with reference to FIGS. 12–14. Each of the lenses 82 bridges two adjacent heat sinks 62 (FIGS. 12–14) such that its center point is approximately over the emission point of the laser diode bars. Thus, the laser diode array 80 can produce a variety of laser beam outputs depending upon the type of lens 82 that is employed. It should be noted that the UV radiation can be exposed to the entire laser diode array 80, instead of each package 60, to activate the UV-activated radiation and secure the array of lenses 82 in their final state.

Figure 16:
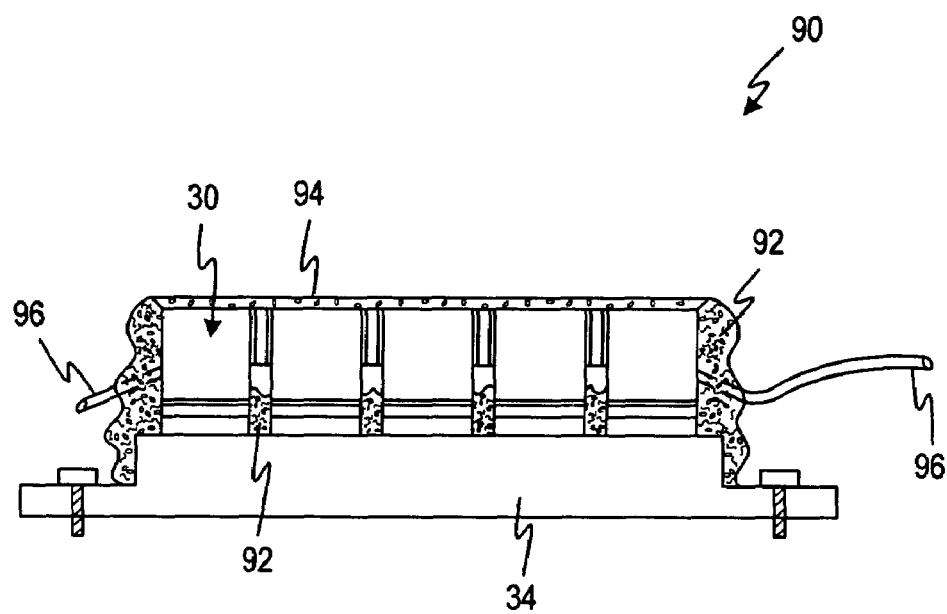
FIG. 16 is a cross-sectional view of a laser diode array having potting material present therearound.

FIG. 16 illustrates a cross-section of an alternative laser diode array assembly 90 which has the laser diode array 30 mounted on the heat spreader 34, as described previously in FIG. 5, with potting material placed entirely therearound. A first potting material 92 is present along the sides of the laser diode arrays 30 and on the front and back faces (i.e. in the plane of the paper) of the laser diode array 30. The potting material 92 can also be present between adjacent heat sinks of the packages. A second potting material 94 that is transparent to the optical energy being emitted from the laser diode array 30 is at the top of the laser diode array 30. The potting materials 92 and 94 can be made of various materials including, for example, an RTV.

Two leads 96 extend from the outer heat sinks through the potting material 92. Thus, the only portions of the laser diode array assembly 90 which are exposed to the environment are the two leads 96 and the bottom of the heat spreader 34. This laser diode array assembly 90 can be used in a variety of atmospheres which would normally contaminate the laser diode array 30. Furthermore, placing potting material 92 around the heat sinks 12 which conduct the electrical current can minimize the chance for current arcing between the heat sinks 12 and the metallic heat spreader 34 positioned below it. Minimizing the chances for current arcing is especially important in arrays having large numbers of laser diodes where higher voltages are required to produce the desired optical output.

Each of these embodiments and obvious variations thereof is contemplated as falling within the spirit and scope of the invention, which is set forth in the following claims.

What is claimed is:

1. A method of manufacturing an individual laser diode package to be used in a laser diode array, comprising:
   providing a laser diode bar;
   providing a heat sink having upper and lower portions, said heat sink having a heat sink height and a heat sink width, said heat sink width being less than said heat sink height;
   providing an electrically insulative substrate, said electrically insulative substrate having a substrate width that is approximately equal to said heat sink width;
   soldering said laser diode to said upper portion of said heat sink so as to leave a surface of said laser diode opposing said heat sink exposed; and
   soldering said electrically insulative substrate to said lower portion of said heat sink.

2. The method of claim 1, wherein said soldering steps occur substantially simultaneously.

3. The method of claim 1, further including the step of adding a solder layer to said exposed surface of said laser diode opposing said heat sink.

4. The method of claim 1, further including the step of applying a solder layer to exterior surfaces of said heat sink.

5. The method of claim 4, further including the step of allowing said solder layer to solidify on said heat sink without contacting any other structure.

6. The method of claim 4, wherein said steps of soldering said electrically insulative substrate and said laser diode include the steps of contacting said electrically insulative substrate and said laser diode to said solder layer of said heat sink and heating said heat sink.

7. The method of claim 6, further including the step of applying a solder layer to said exposed surface of said laser diode.

8. The method of claim 7, wherein said solder layer on said exposed surface of said laser diode has a lower melting temperature than the solder used for said steps of soldering said laser diode and said electrically insulative substrate to said heat sink.

9. The method of claim 1, further including the step of cleaning said laser diode after said soldering steps.

10. The method of claim 9, wherein the step of cleaning said laser diode includes spraying acetone on reflective and emitting surfaces of said laser diode.

11. A method of manufacturing a laser diode array having a plurality of individual laser diode packages, comprising:
   providing a plurality of laser diode bars;
   providing a plurality of heat sinks, each of said heat sinks having a bottommost surface and an uppermost surface;
   providing a plurality of electrically insulative substrates;
   developing each of said plurality of individual laser diode packages by,
      soldering one of said laser diodes to one of said heat sinks at a location adjacent to said uppermost surface so as to leave a surface of said laser diode opposing said heat sink exposed, and
      soldering one of said electrically insulative substrates to said bottommost surface of said heat sink; and
   for each of said plurality of individual laser diode packages, soldering said exposed surface of said laser diode to a heat sink of an adjacent laser diode package.

12. The method of claim 11, wherein said soldering of said laser diode to said heat sink is with a solder having a higher melting temperature than said soldering of said exposed surface to a heat sink of an adjacent laser diode package.

13. The method of claim 11, further including the step of applying an array solder layer to said exposed surface of said laser diode.

14. The method of claim 11, wherein said plurality of electrically insulative substrates are primarily composed of gallium arsenide.

15. The method of claim 11, wherein each of said laser diodes includes an emitting surface and a reflective surface, said emitting surface being generally parallel and adjacent to said uppermost surface of said laser diode.

16. The method of claim 15, wherein said emitting surface of said laser diode is substantially flush with said uppermost surface of said heat sink.

17. The method of claim 11, wherein said soldering said laser diode to said heat sink and said soldering of said electrically insulative substrate to said heat sink uses the same solder.

18. A method of manufacturing a laser diode array having a plurality of individual laser diode packages, comprising:

developing each of said plurality of individual laser diode packages, including (i) soldering a laser diode to a heat sink having a height defined between an uppermost surface and a bottommost surface and (ii) attaching an electrically insulative substrate to said bottommost surface of said heat sink, said electrically insulative substrate being associated with only one heat sink and for electrically insulating said heat sink from a metallic heat sinking structure to be located below said individual laser diode package; and soldering said laser diode in each of said individual laser diode packages to a heat sink of an adjacent package.

19. The method of claim 18, further including the step of applying an array solder layer to an exposed surface of said laser diode, said soldering said laser diode in each of said individual laser diode packages to a heat sink using said solder layer.

* * * * *